United States Patent [19]
Gardner et al.

[11] Patent Number: 6,093,611
[45] Date of Patent: Jul. 25, 2000

[54] OXIDE LINER FOR HIGH RELIABILITY WITH REDUCED ENCROACHMENT OF THE SOURCE/DRAIN REGION

[75] Inventors: Mark I. Gardner, Cedar Creek; Derick Wristers; H. Jim Fulford, Jr., both of Austin, all of Tex.

[73] Assignee: Advanced Micro Devices, Inc., Sunnyvale, Calif.

[21] Appl. No.: 08/994,502

[22] Filed: Dec. 19, 1997

[51] Int. Cl.[7] .......................... H01L 21/336; H01L 21/76
[52] U.S. Cl. .................... 438/295; 438/296; 438/404; 438/424
[58] Field of Search .................... 438/295, 296, 438/404, 424, FOR 222

[56] References Cited

U.S. PATENT DOCUMENTS

| | | |
|---|---|---|
| 5,661,072 | 8/1997 | Jeng . |
| 5,811,347 | 9/1998 | Gardner et al. . |
| 5,851,899 | 12/1998 | Weigand . |
| 5,854,121 | 12/1998 | Gardner et al. . |
| 5,891,787 | 4/1999 | Gardner et al. . |

OTHER PUBLICATIONS

Sze, S.M., Semiconductor Devices, John Wiley & Sons, pp. 360–362, 1985.
Wolf, S. and Tauber, R.N., Silicon Processing for the VLSI Era, Lattice Press, p.546, 1986.

Primary Examiner—John F. Niebling
Assistant Examiner—Josetta I. Jones
Attorney, Agent, or Firm—Joseph Lally; Devan & Lally, L.L.P.

[57] ABSTRACT

A semiconductor process in which a first nitrogen bearing oxide is formed on an upper surface of a semiconductor substrate. A silicon nitride layer is then formed on the nitrogen bearing oxide. The first oxide and the silicon nitride layer are then patterned to expose an upper surface of the substrate over a trench region of the substrate. An isolation trench is then etched into the trench region of the substrate and a nitrogen bearing liner oxide is then formed on sidewalls and a floor of the trench. An isolation dielectric is then formed within the trench and, thereafter, the silicon nitride layer is removed from the wafer. A suitable thickness of the first nitrogen bearing oxide and of the liner oxide is in the range of approximately 30 to 100 angstroms. A consumption of adjacent active regions caused by the thermal oxidation process is preferably less than approximately 50 angstroms.

25 Claims, 2 Drawing Sheets

OXIDE LINER FOR HIGH RELIABILITY WITH REDUCED ENCROACHMENT OF THE SOURCE/DRAIN REGION

BACKGROUND OF THE INVENTION

1. Field of the Invention

The present invention relates to the field of semiconductor processing and more particularly to a method of forming an oxide liner in a shallow trench isolation structure to improve reliability and reduce the consumption or encroachment of the source/drain or active regions.

2. Description of the Relevant Art

In the fabrication of semiconductor integrated circuits, a plurality of transistors are fabricated into a monolithic substrate. The individual transistors are typically isolated from one another by fabricating various types of silicon dioxide structures between adjacent transistors. In a LOCOS isolation process, the isolation or field regions of the substrate are thermally oxidized to form a relatively thick field oxide structure in the field regions of the substrate. Because the thermal oxidation of silicon is known to consume a portion of the silicon substrate, the LOCOS field oxide extends into the field region of the silicon substrate and provides an isolation material between adjacent active regions of the integrated circuit. The selective oxidation of the field regions in a LOCOS process is achieved by patterning a silicon nitride layer over the active regions of the substrate prior to performing the thermal oxidation step. Although the details of LOCOS processing are familiar to the semiconductor manufacturing industry, LOCOS processing involves drawbacks that make it less than desirable in a variety of advanced processes.

The thermal oxidation process used to fabricate the LOCOS field oxide structure is well known for creating a laterally oriented bird's beak structure that extends into the active regions of the substrate. The consumption of the active regions of the substrate during the LOCOS field oxidation process undesirably consumes regions of the semiconductor substrate that would otherwise be available for active devices such as MOS transistors. It is desirable to fabricate as many transistors into a given area of the substrate as possible to achieve the complex circuits associated with modern VLSI integrated circuits. In addition to the consumption of active regions that occurs during a typical LOCOS field oxidation process, the thermal oxidation process required to achieve a desirable field oxide thickness is typically relatively long in duration. If, for example, a process requires a field oxide with a thickness in excess of approximately 3,000 to 5,000 angstroms, the required thermal oxidation cycle to achieve this thickness is typically in excess of 60 minutes or more. As will be readily appreciated, process steps that require more time are generally undesirable because of the increased cost associated with such processes and the reduced throughput that results from the longer processing times. In addition to the expense and complexity associated with long processing cycles, manufacturers typically try to avoid subjecting a semiconductor wafer to a long thermal process after any impurity distributions have been introduced into the substrate. In many fabrication processes, for example, one or more ion implantation processes have been performed prior to the field oxidation step. These impurity distributions that are present in the substrate prior to the thermal oxidation process will be significantly redistributed during the high temperature processing necessary to generate a sufficient oxide growth rate during the field oxidation step.

For the reasons described, semiconductor manufacturers have sought alternatives to the LOCOS isolation process. In a shallow trench isolation process, a trench is etched into the field regions of the semiconductor substrate and, thereafter, filled with an electrically insulating material to prevent inadvertent coupling of adjacent source/drain regions of neighboring transistors. Although the shallow trench isolation process eliminates the long cycle times and bird's beak formation associated with LOCOS processes, conventional shallow trench isolation processes are not without their drawbacks. It is known that, if the shallow trench isolation dielectric is comprised entirely of a deposited dielectric such as a CVD silicon dioxide formed from a TEOS or silane source, the relatively poor bonding between the deposited dielectric and the surrounding silicon substrate can result in excessive leakage currents and possibly a reduced field threshold voltage. (A field threshold voltage refers to a minimum voltage that must be present above the field isolation structure to generate a channel underneath the isolation structure that forms an unintended conductive path between adjacent source drain regions of neighboring transistors.) It will be appreciated that obtaining the highest possible field threshold voltage is desirable to ensure the highest quality integrated circuit. To improve the interface between the conventional shallow trench isolation process and the surrounding silicon substrate, manufacturers have attempted to line the isolation trench with a thermally formed silicon dioxide. Unfortunately, manufacturers have typically found that, in order to produce a trench liner oxide sufficient to make a significant difference in terms of the liability of the device, the thickness of the liner oxide must be made undesirably large. Thick liner oxides are undesirable in shallow trench isolation processes because the trench liner, like other thermally formed oxides, consumes a portion of the silicon upon which the oxide is grown. In a shallow trench process, the silicon consumed during a liner oxide formation process comprises the active region of the transistor, namely, the source/drain regions. Consistent with the desire to maximize the available active region space and to minimize the amount of silicon real estate dedicated to the isolation structures, it is desirable from a manufacturing perspective to produce isolation dielectric structures with a minimum thickness to minimize the consumption of the active regions.

Even if liner oxides in conventional shallow trench isolation processes were sufficiently thin to address any concerns about the amount of active region consumed by the isolation structures, it is typically difficult to fabricate an isolation structure that adequately prevents migration of mobile impurities within the substrate through the isolation dielectric and possibly settling in an active region of the integrated circuit thereby potentially resulting in the formation of an unwanted impurity distribution within the integrated circuit. Such unwanted impurity distributions can accumulate over the lifetime of the integrated circuit causing undesired effects such as shifts in the threshold voltages of the integrated circuit.

Accordingly, it would be desirable to implement a semiconductor fabrication process in which the manufacturing problems associated with the formation of conventional isolation structures were addressed without significantly increasing the complexity, cost, or manufacturability of the process.

SUMMARY OF THE INVENTION

The problems identified above are in large part addressed by a semiconductor fabrication process in which a nitrogen bearing liner oxide is formed adjacent to and in contact with a shallow trench isolation structure displaced between a pair of active regions in a semiconductor substrate. The introduction of nitrogen into the oxide liner of a shallow trench isolation process improves reliability by providing an effective barrier layer against the mobile contaminants. In addition, the relatively thin oxide thickness obtainable in such a process reduces the amount of silicon consumption that occurs at the interface between the active and field regions of the integrated circuit.

Broadly speaking, it is an object of the present invention to provide a semiconductor process in which a first nitrogen bearing oxide is formed on an upper surface of a semiconductor substrate. A silicon nitride layer is then formed on the nitrogen bearing oxide. Thereafter, the first oxide and the silicon nitride layer are patterned to expose an upper surface of the substrate over a trench region of the substrate. An isolation trench is then etched into the trench region of the substrate and a nitrogen bearing liner oxide is formed on sidewalls and floor of the trench. An isolation dielectric is then formed within the trench and the silicon nitride layer removed.

Preferably, the formation of the nitrogen bearing oxide is accomplished by immersing the substrate into an oxidation chamber maintained at a temperature in the range of approximately 400 to 900° C. An oxidation chamber used for the fabrication process includes oxygen and a nitrogen bearing species in the presently preferred embodiment. The nitrogen bearing species is suitably comprised of a nitrogen bearing impurity such as $N_2$, NO, $N_2O$, or $NH_3$. A preferred thickness of the first nitrogen bearing oxide is preferably in the range of approximately 30 to 100 angstroms. The formation of the silicon nitride layer is accomplished in the preferred embodiment by decomposing silane and ammonium in a CVD reactor chamber maintained at a temperature in the range of approximately 250 to 800° C. and a pressure of less than approximately 2 torr.

In one embodiment, the patterning of the first oxide and the silicon nitride layer is accomplished by depositing a photoresist layer on the nitride layer, selectively exposing the photoresist, and then removing the exposed portions of the photoresist layer. Portions of the first oxide and silicon nitride layers that are aligned above the isolation regions of the substrate are then removed. Preferably, the etching of the isolation trench is accomplished with a plasma etch process in which a carbon and fluorine bearing plasma is utilized. The formation of the nitrogen bearing liner oxide typically includes immersing the substrate into an oxygen chamber maintained at a temperature in the range of approximately 400 to 900° C. for a duration in the range of approximately 2 to 20 minutes. The oxidation chamber ambient comprises oxygen and a nitrogen bearing species. In one embodiment, the nitrogen bearing species used for the fabrication of the liner oxide comprises $N_2$, $N_2O$, NO, or $NH_3$. In the preferred embodiment, a thickness of the nitrogen bearing liner oxide is in the range of approximately 30 to 100 angstroms. The filling of the trench with an isolation dielectric is accomplished in one embodiment by forming spacers on sidewalls of the trench and, afterwards, filling the trench with a CVD dielectric. The CVD dielectric is then planarized to provide a relatively planar substrate surface upon which subsequent processing steps may be more accurately and readily achieved. Preferably, the present invention further includes removing the first nitrogen bearing oxide layer from the upper surface of the substrate and growing a gate dielectric on the upper surface in an oxygen bearing ambient maintained at a temperature in the range of approximately 400 to 900° C. for a duration in the range of approximately 2 to 20 minutes.

It is a further object of this invention to provide an isolation portion of an integrated circuit. The isolation portion includes a semiconductor substrate comprising first and second active regions laterally displaced on either side of an isolation region. The first and second active regions comprise a doped silicon. The isolation region comprises an isolation dielectric. A nitrogen bearing liner oxide separates the isolation dielectric from the active regions. Preferably, the silicon substrate includes a lightly doped p-type layer formed on a heavily doped p+ layer. Preferably, a resistivity of the lightly doped layer is in the range of approximately 10 to 15 $\Omega$-cm. A preferred thickness of the nitrogen bearing liner oxide is in the range of approximately 30 to 100 angstroms. The isolation dielectric is preferably comprised of a CVD silicon dioxide. The liner oxide extends into the active regions of the substrate by an amount less than approximately 50 angstroms.

It is a still further object of the invention to provide for a method of forming an isolation structure in a semiconductor fabrication process. A trench is etched into a semiconductor substrate wherein the trench is laterally displaced between first and second active regions of the semiconductor substrate. A nitrogen bearing liner oxide is then grown on sidewalls and a floor of the trench. The trench is then filled with an isolation dielectric. Preferably the growth of the nitrogen bearing liner oxide consumes a portion of the active regions at an interface between the liner oxide and the active regions where a lateral dimension of the active region consumed by the liner oxide growth process is less than approximately 50 angstroms. In one embodiment, a thickness of the liner oxide is in the range of approximately 30 to 100 angstroms. Preferably, the formation of the nitrogen bearing liner oxide is accomplished by immersing the substrate in an oxidation chamber maintained at a temperature in the range of approximately 200 to 900° C. The oxidation ambient within the oxidation chamber is preferably comprised of oxygen and a nitrogen bearing species such as $N_2$, NO, $N_2O$, or $NH_3$.

BRIEF DESCRIPTION OF THE DRAWINGS

Other objects and advantages of the invention will become apparent upon reading the following detailed description and upon reference to the accompanying drawings in which.

Figure 1:
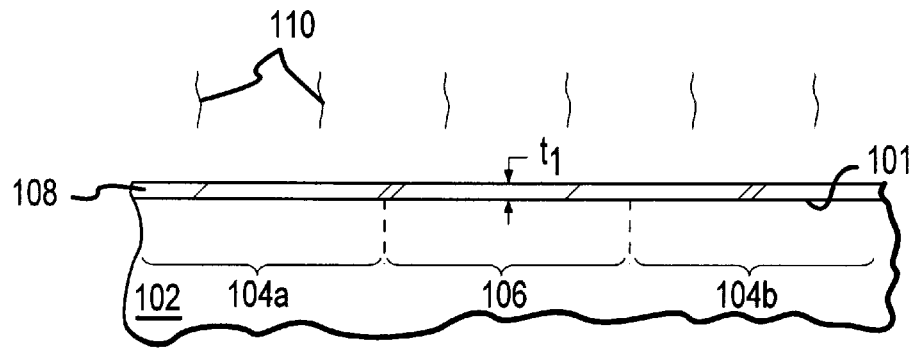
FIG. 1 is a partial cross-sectional view of a semiconductor substrate upon which a nitrogen bearing oxide has been formed.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Turning now to the drawings, FIGS. 1–6 depict a presently preferred processing sequence for producing a highly reliable shallow trench isolation structure using an extremely thin liner oxide to minimize or eliminate the consumption or encroachment upon the active regions of the substrate. Turning to FIG. 1, a first dielectric 108 is formed on an upper surface 101 of a semiconductor substrate 102. The substrate 102 includes first and second active regions 104a and 104b respectively laterally displaced on either side of an isolation region 106. As their names imply, the active regions 104 refer to regions of semiconductor substrate 102 into which active devices such as MOS transistors will subsequently be fabricated while isolation region 106 refers to a region of substrate 102 into which an isolation structure such as a shallow trench dielectric will be formed. In the preferred embodiment, the first oxide layer 108 is achieved by a thermal oxidation process represented in FIG. 1 by reference numeral 110 in which semiconductor substrate 102 is immersed into an oxidation chamber maintained at a temperature in the range of approximately 400 to 900° C. for a duration in the range of approximately 2 to 20 minutes. Preferably, a dry oxidation process is used optionally including the presence of a chlorine bearing species such as HCl or TCE is present.

Preferably, thermal oxidation process 110 is accomplished in a nitrogen bearing ambient such that first oxide layer 108 comprises a nitrogen bearing oxide. A suitable nitrogen bearing species useful for incorporating nitrogen into the ambient during thermal oxidation process 110 is comprised of $N_2$, $N_2O$, NO, or $NH_3$, or other suitable nitrogen bearing species. In a preferred embodiment, a thickness $t_1$ of first oxide layer 108 is preferably in the range of approximately 30 to 100 angstroms. By incorporating nitrogen into first oxide layer 108, it is theorized that a relatively thin (i.e., less than approximately 100 angstroms) oxide film may be sufficient to form a pad layer upon which a silicon nitride layer may be deposited and etched. It is further theorized that the presence of the nitrogen within the oxidation ambient may, under suitable conditions, retard the oxidation rate such that obtaining precise control over the film thickness $t_1$ of first dielectric layer 108 is facilitated. Typically, semiconductor substrate 102 comprises a single crystal silicon wafer as will be familiar to those skilled in the fabrication of integrated circuits. In the preferred embodiment, semiconductor substrate 102 comprises a starting material that includes a p-type lightly doped layer formed over a heavily doped p+ bulk. In one embodiment, the lightly doped layer is formed by an epitaxial growth process to produce the lightly doped region over a heavily doped bulk. Preferably, a resistivity of the lightly doped upper region of semiconductor substrate 102 has a resistivity of approximately 10 to 15 Ω-cm.

Figure 2:
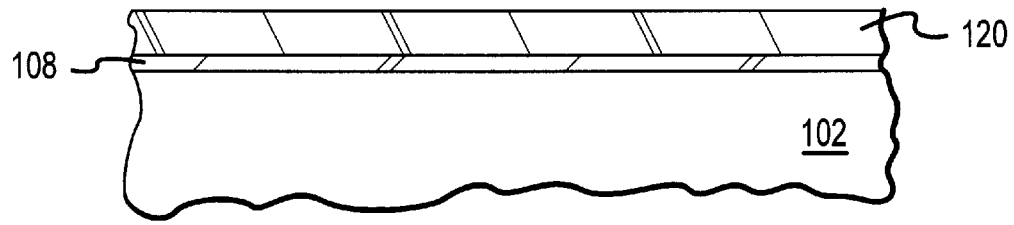
FIG. 2 is a processing step subsequent to FIG. 1 in which a silicon nitride layer has been formed over the oxide layer.

Turning now to FIG. 2, a silicon nitride layer 120 is formed over first oxide layer 108. In a presently preferred embodiment, the formation of silicon nitride layer 120 is accomplished by thermally decomposing silane and ammonium in a CVD reactor chamber maintained at a temperature in the range of approximately 250 to 800° C. and a pressure of less than approximately 2 torr. The deposited silicon nitride layer facilitates the selective oxidation of portions of semiconductor substrate 102 during a subsequent thermal oxidation. The first oxide layer 108 provides a pad layer upon which silicon nitride layer 120 is located. In the absence of a suitable pad layer, as deposited silicon nitride characteristically imparts significant stress onto an underlying silicon substrate potentially causing undesirable lattice dislocations that could negatively affect the performance of the integrated circuit.

Figure 3:
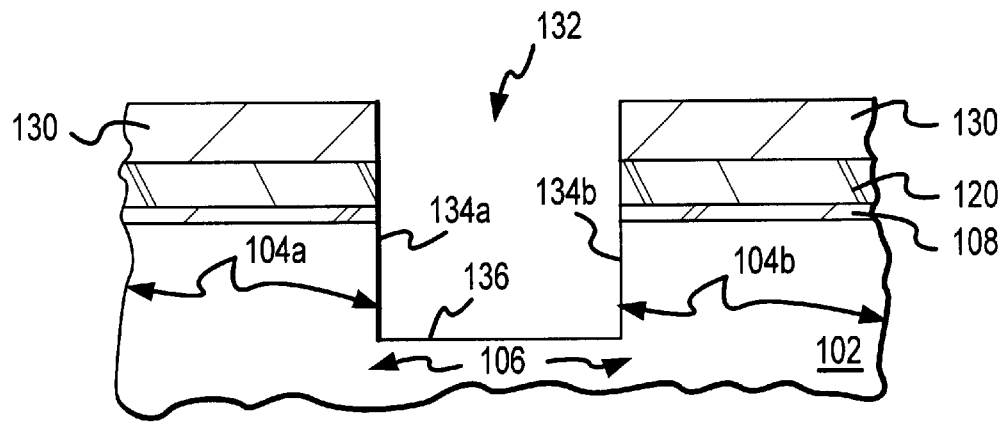
FIG. 3 is a processing step subsequent to FIG. 2 in which a photoresist layer has been patterned over the silicon nitride layer and, thereafter, an isolation trench etched into the exposed regions of the underlying substrate.

Turning now to FIG. 3, first oxide layer 108 and silicon nitride layer 120 are patterned over the isolation region 106 of substrate 102 and, thereafter, an etch process is performed to produce an isolation trench 102 residing substantially within the isolation region 106 as shown in FIG. 1. Preferably, the patterning of first oxide layer 108 and silicon nitride layer 120 is accomplished by patterning a photoresist layer represented in FIG. 3 by reference numeral 130 on an upper surface of silicon nitride layer 120. The patterning of photoresist layer 130 is accomplished in a conventional fashion in which portions of photoresist layer 130 are selectively exposed using a photolithography masking process followed by a resist develop process. A plasma etch is then performed to produce isolation trench 132 by immersing substrate 102 into a CVD reactor chamber using a source gas including fluorine and carbon. Preferably, isolation trench 132 produces trench sidewalls 134a and 134b and a trench floor 136 all as shown in FIG. 3.

Figure 4:
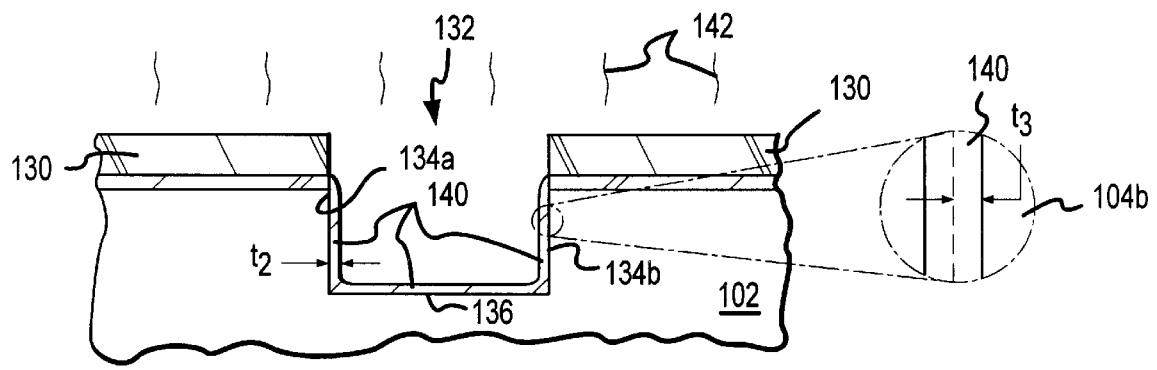
FIG. 4 is a processing step subsequent to FIG. 3 in which a liner oxidation process is performed to produce a liner oxide on the sidewalls and floor of the isolation trench.

Turning now to FIG. 4, a liner oxide 140 is formed on the sidewalls 134 and trench floor 136 of isolation trench 132. Prior to the formation of liner oxide 140, the patterned photoresist layer 130 (as shown in FIG. 3) is removed from the upper surface of silicon nitride layer 130. In the preferred embodiment, the formation of liner oxide 140 is accomplished with a thermal oxidation process represented in FIG. 4 by reference numeral 142 in which semiconductor substrate 102 is immersed in an oxygen and nitrogen bearing ambient maintained at a temperature in the range of approximately 400 to 900° C. for a duration in the range of approximately 2 to 20 minutes using, similar to the oxidation process 110 described with respect to FIG. 1, a dry $O_2$ process into which a chlorine bearing species may be optionally introduced. The presence of nitrogen within the ambient during the oxidation process 142 tends to retard the rate at which the oxide grows thereby facilitating the formation of extremely thin (i.e., less than approximately 50 angstroms) dielectric structures in a reproducible fashion.

In the preferred embodiment, the liner oxide 140 includes a nitrogen bearing species that will beneficially prevent mobile impurities within the adjacent active regions of semiconductor substrate 102 from migrating through the intermediate dielectric structure thereby degrading the integrity of the isolation dielectric and possibly preventing the mobile impurities from redistributing into adjacent active regions of the integrated circuit, thereby potentially causing a threshold voltage shift rendering some of the devices unreadable. In a presently preferred embodiment, a thickness $t_2$ of liner oxide 140 is preferably in the range of approximately 30 to 100 angstroms. In addition to providing an excellent barrier layer as described previously, the introduction of nitrogen bearing impurity into liner oxide 140 is theorized to reduce the amount of silicon encroachment caused by the thermal oxidation process that generates liner oxide 110. Thus, the present invention contemplates the formation of a liner oxide 140 that consumes or encroaches upon an adjacent active region 104b by an amount represented in FIG. 4 as t₃ wherein the encroachment is less than approximately 50 angstroms. Thus, the incorporation of nitrogen into an oxide structure prior to source/drain processing in the conventional semiconductor process enables minimization of the encroachment into the active regions of the semiconductor substrate.

Figure 5:
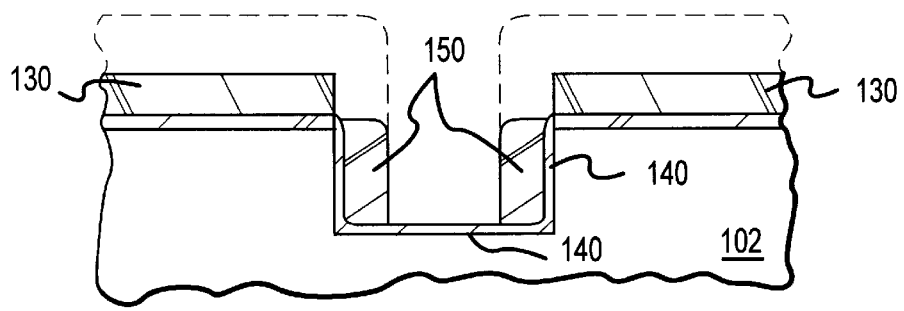
FIG. 5 is a processing step subsequent to FIG. 4 in which dielectric spacers have been formed in contact with the liner oxide over the sidewalls of the isolation trench.
Figure 6:
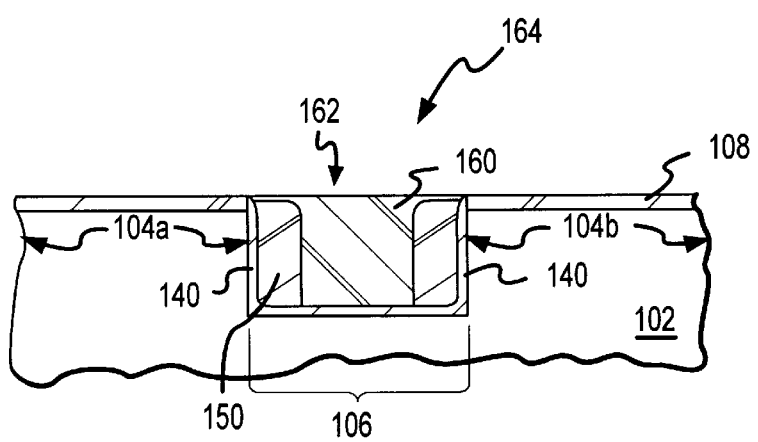
FIG. 6 is a processing step subsequent to FIG. 5 in which the isolation trench is filled with a dielectric and, afterwards, planarized to remove portions of the dielectric from regions exterior to the isolation trench.

Turning now to FIGS. 5 and 6, a presently preferred processing sequence for filling isolation trench 132 with an isolation dielectric (represented in FIG. 6 by reference numeral 162) is shown. Referring to FIG. 5, spacer structures 150 are formed on sidewalls of the isolation trench 132. The formation of spacers 150 within the isolation trench is theorized to beneficially facilitate the subsequent filling of isolation trench 132. In the preferred sequence, spacers 150 are formed by depositing a first dielectric material typically using a CVD TEOS process at low pressure such that the deposited film is substantially conformal (i.e., a film that varies less than approximately 20% across the surface of the wafer). After the deposition of the dielectric material, an anisotropic plasma etch process is typically performed to remove the substantially horizontal portions of the deposited film.

Referring now to FIG. 6, the isolation dielectric 162 is completed with a deposition process (not explicitly shown with a reference numeral) in which isolation trench 132 is filled with a dielectric material 160 preferably using a CVD silicon dioxide deposition process. Subsequent to the deposition, portions of the isolation dielectric exterior to isolation trench 132 are removed typically through the use of a planarization process such as a chemical mechanical polish, resist/etchback process, or other suitable planarization process. Subsequent to the planarization process, an isolation portion 164 of an integrated circuit has been completed according to the present invention. The isolation portion 164 includes semiconductor substrate 102 including the first active region 104a and second active region 104b laterally displaced on either side of an isolation region 106. First and second active regions 104a and 104b are comprised essentially of doped silicon (i.e., the active regions contain no significant presence of an insulating material such as a dielectric). The isolation region 106, on the other hand, includes an isolation dielectric 162. A nitrogen bearing liner oxide 140 separates isolation dielectric 162 from the active regions 104a and 104b of semiconductor substrate 102. As stated previously, a thickness of liner oxide 140 is in the range of approximately 30 to 100 angstroms. Isolation dielectric 162 comprises, in one embodiment, CVD spacers 150 in contact with the sidewalls of liner oxide 140 in addition to the CVD silicon dioxide used to fill the remaining portions of isolation trench 132. In one embodiment, the first oxide layer 108 as shown in FIG. 6 is then removed from semiconductor substrate 102, preferably through the use of a wet or dry etch process and, thereafter, subsequently a gate dielectric material is regrown on semiconductor substrate 102. In an alternative embodiment, the first oxide layer 108 may be left in place and used as a gate dielectric in a subsequent processing step by reducing a thickness of liner oxide 140 and incorporating nitrogen into the liner oxide, the present invention is theorized to improve reliability, reduce susceptibility to mobile impurity migration, and results in less consumption of the active regions 104 of silicon substrate 102. In an alternative embodiment, first oxide layer 108 may serve as the gate dielectric itself.

It will be apparent to those skilled in the art having the benefit of this disclosure that the present invention contemplates a method for introducing a highly reliable and thin liner oxide in a trench isolation process. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A semiconductor process, comprising:
   forming a first nitrogen bearing oxide on an upper surface of a semiconductor substrate;
   forming a silicon nitride layer on said nitrogen bearing oxide;
   patterning said first oxide and said silicon nitride layer to expose an upper surface of said semiconductor substrate over a trench region of said semiconductor substrate;
   etching an isolation trench into said trench region of said semiconductor substrate;
   forming a nitrogen bearing liner oxide on sidewalls and a floor of said trench;
   forming spacers on the sidewalls of said trench and, thereafter, filling said trench with a CVD dielectric; and
   removing said silicon nitride layer.

2. The process of claim 1, wherein the step of forming said nitrogen bearing oxide comprises immersing said semiconductor substrate in an oxidation chamber maintained at a temperature in the range of approximately 400 to 900° C., and wherein said oxidation chamber comprises oxygen and a nitrogen bearing species.

3. The process of claim 2, wherein said nitrogen bearing species is selected from the group comprising $N_2$, NO, $N_2O$, and $NH_3$.

4. The process of claim 1, wherein the step of forming said silicon nitride layer comprises thermally decomposing silane and ammonium in a CVD reactor chamber maintained at a temperature in the range of approximately 250 to 800° C. and a pressure of less than approximately 2 torr.

5. The process of claim 1, wherein the step of patterning said first oxide and silicon nitride layer comprises:
   depositing a photoresist layer on said silicon nitride layer, selectively exposing said photoresist, and, thereafter, removing exposed portions of said photoresist layer; and
   removing portions of said first oxide and silicon nitride aligned below an exposed upper surface of said silicon nitride layer with a plasma etch.

6. The process of claim 1, wherein the step of etching said isolation trench comprises a plasma etch process using a carbon and fluorine bearing plasma.

7. The process of claim 1, wherein the step of forming said nitrogen bearing liner oxide comprises immersing said semiconductor substrate in an oxidation chamber maintained at a temperature in the range of approximately 400 to 900° C., wherein an ambient within said oxidation chamber comprises oxygen and a nitrogen bearing species.

8. The process of claim 7, wherein said nitrogen bearing species comprises $N_2$, $N_2O$, NO, or $NH_3$.

9. The process of claim 1, wherein a thickness of said nitrogen bearing liner oxide is in the range of approximately 30 to 100 angstroms.

10. The process of claim 1, further comprising, following said filling of said trench, planarizing said CVD dielectric to substantially removed portions of said CVD dielectric exterior to said isolation trench.

11. The process of claim 1, further comprising:

removing said first nitrogen bearing oxide layer form said upper surface of said semiconductor substrate; and growing a gate dielectric layer on said upper surface of said semiconductor substrate in an oxygen bearing ambient maintained at a temperature in the range of approximately 400 to 900° C. for a duration in the range of approximately 2 to 20 minutes.

12. In a semiconductor fabrication process, a method of forming an isolation structure, said method comprising:

etching a trench in a semiconductor substrate, said trench laterally displaced between first and second active regions of said semiconductor substrate;

growing a nitrogen bearing liner oxide on sidewalls and a floor of said trench wherein said growing of said nitrogen bearing liner oxide consumes a portion of said active regions at an interface between said liner oxide and said active regions wherein a lateral dimension of said consumed active regions is less than approximately 50 angstroms; and filling said trench with an isolation dielectric.

13. The process of claim 12, wherein a thickness of said liner oxide is in the range of approximately 30 to 100 angstroms.

14. The process of claim 12, wherein the step of forming said nitrogen bearing liner oxide comprises immersing said semiconductor substrate in an oxidation chamber maintained at a temperature in the range of approximately 400 to 900° C., wherein an ambient within said oxidation chamber comprises oxygen and a nitrogen bearing species.

15. A semiconductor process, comprising:

forming a first nitrogen bearing oxide with a thickness in the range of approximately 30 to 100 angstroms on an upper surface of a semiconductor substrate;

forming a silicon nitride layer on said nitrogen bearing oxide;

patterning said first oxide and said silicon nitride layer to expose an upper surface of said semiconductor substrate over a trench region of said semiconductor substrate;

etching an isolation trench into said trench region of said semiconductor substrate;

forming a nitrogen bearing liner oxide on sidewalls and a floor of said trench;

forming an isolation dielectric within said trench;

removing said silicon nitride layer.

16. The process of claim 15, wherein the step of forming said nitrogen bearing oxide comprises immersing said semiconductor substrate in an oxidation chamber maintained at a temperature in the range of approximately 400 to 900° C., and wherein said oxidation chamber comprising oxygen and a nitrogen bearing species.

17. The process of claim 16, wherein said nitrogen bearing species is selected from the group comprising $N_2$, NO, $N_2O$, and $NH_3$.

18. The process of claim 15, wherein the step of forming said silicon nitride layer comprises thermally decomposing silane and ammonium in a CVD reactor chamber maintained at a temperature in the range of approximately 250 to 800° C. and a pressure of less than approximately 2 torr.

19. The process of claim 15, wherein the step of patterning said first oxide and silicon nitride layer comprises:

depositing a photoresist layer on said silicon nitride layer, selectively exposing said photoresist, and, thereafter, removing exposed portions of said photoresist layer; and removing portions of said first oxide and silicon nitride aligned below an exposed upper surface of said silicon nitride layer with a plasma etch.

20. The process of claim 15, wherein the step of etching said isolation trench comprises a plasma etch process using a carbon and fluorine bearing plasma.

21. The process of claim 15, wherein the step of forming said nitrogen bearing liner oxide comprises immersing said semiconductor substrate in an oxidation chamber maintained at a temperature in the range of approximately 400 to 900° C., wherein an ambient within said oxidation chamber comprises oxygen and a nitrogen bearing species.

22. The process of claim 21, wherein said nitrogen bearing species comprises $N_2$, $N_2O$, NO, or $NH_3$.

23. The process of claim 15, wherein a thickness of said nitrogen bearing liner oxide is in the range of approximately 30 to 100 angstroms.

24. The process of claim 15, wherein the step of filling said trench with an isolation trench comprises:

forming spacers on sidewalls of said trench and, thereafter, filling said trench with a CVD dielectric; and planarizing said CVD dielectric to substantially removed portions of said CVD dielectric exterior to said isolation trench.

25. The process of claim 15, further comprising:

removing said first nitrogen bearing oxide layer form said upper surface of said semiconductor substrate; and growing a gate dielectric layer on said upper surface of said semiconductor substrate in an oxygen bearing ambient maintained at a temperature in the range of approximately 400 to 900° C. for a duration in the range of approximately 2 to 20 minutes.

* * * * *